(12) United States Patent
Fulton et al.

(10) Patent No.: US 12,282,043 B2
(45) Date of Patent: Apr. 22, 2025

(54) METER COLLAR ADAPTER WITH ELECTRIC LOAD MANAGEMENT AND OVERCURRENT PROTECTION

(71) Applicant: INFINITE INVENTION INC., Falls Church, VA (US)

(72) Inventors: Whitman Fulton, Falls Church, VA (US); John Schroeder, Falls Church, VA (US); Benjamin Lewis, Falls Church, VA (US); Jon Knauer, Falls Church, VA (US); Khanti Munro, Falls Church, VA (US); Akash Dani, Falls Church, VA (US)

(73) Assignee: Infinite Invention Inc., Falls Church, VA (US)

( * ) Notice: Subject to any disclaimer, the term of this patent is extended or adjusted under 35 U.S.C. 154(b) by 0 days.

(21) Appl. No.: 17/663,362

(22) Filed: May 13, 2022

(65) Prior Publication Data

US 2023/0028679 A1    Jan. 26, 2023

Related U.S. Application Data

(60) Provisional application No. 63/223,732, filed on Jul. 20, 2021.

(51) Int. Cl.
*G01R 11/04*      (2006.01)
*G01R 22/06*      (2006.01)
*H01R 31/06*      (2006.01)

(52) U.S. Cl.
CPC ............ *G01R 11/04* (2013.01); *G01R 22/065* (2013.01); *H01R 31/065* (2013.01); *H01R 2201/20* (2013.01)

(58) Field of Classification Search
CPC ...... H01R 31/00; H01R 31/06; H01R 31/065; G01R 11/00; G01R 11/02; G01R 11/04; G01R 22/00; G01R 22/06; G01R 22/061; G01R 22/065
See application file for complete search history.

(56) References Cited

U.S. PATENT DOCUMENTS 3,653,692 A      4/1972    Henson et al.
5,936,200 A   *   8/1999    Park .................... H01R 4/26
                                                                   174/59

(Continued)

*Primary Examiner* — Huy Q Phan
*Assistant Examiner* — David B Frederiksen
(74) *Attorney, Agent, or Firm* — HSML P.C.

(57) ABSTRACT

A meter collar adapter including a housing, a plurality of contacts to electrically connect the meter collar adapter to a meter socket and to a utility meter, and a load management device within the housing to manage electrical load to an interface circuit with external, co-located electric equipment. The load management device includes an interface circuit to electrically connect to either the line side or load side of an electrical service via the utility meter an external, co-located electric equipment. An interface contact to electrically connect the co-located electric equipment to the interface circuit, an overcurrent protection device electrically connected in series with the interface circuit, an adjustable electrical switch electrically configured to control electric load, and an energy management unit to control, monitor, and/or report a position of the adjustable electrical switch to manage the electrical loads.

20 Claims, 4 Drawing Sheets

(56) References Cited

U.S. PATENT DOCUMENTS

| | | | |
|---|---|---|---|
| 6,633,476 B1* | 10/2003 | Allina | G01R 11/25 |
| | | | 361/111 |
| 8,415,830 B2 | 4/2013 | Lim et al. | |
| 9,246,332 B2 | 1/2016 | Broniak et al. | |
| 9,281,715 B2 | 3/2016 | Lim et al. | |
| 10,038,310 B2 | 7/2018 | Miller et al. | |
| 10,460,329 B2 | 10/2019 | Parks et al. | |
| 10,486,539 B2 | 11/2019 | Corbeil et al. | |
| 11,091,054 B1 | 8/2021 | Passmore et al. | |
| 10,971,933 B2 | 10/2021 | Zweigle et al. | |
| 11,183,843 B1 | 11/2021 | Cooper | |
| 2009/0124119 A1* | 5/2009 | Austin | G01R 11/04 |
| | | | 439/517 |
| 2010/0225305 A1* | 9/2010 | Reineccius | G01R 22/06 |
| | | | 324/126 |
| 2011/0175453 A1* | 7/2011 | Batzler | H02J 9/06 |
| | | | 307/68 |
| 2013/0106397 A1* | 5/2013 | Fulton | H01R 33/945 |
| | | | 439/517 |
| 2014/0127935 A1* | 5/2014 | Scott | H01R 33/945 |
| | | | 439/517 |
| 2014/0218010 A1* | 8/2014 | Fulton | G01R 22/065 |
| | | | 324/110 |
| 2015/0036267 A1* | 2/2015 | Miller | H02B 1/24 |
| | | | 361/625 |
| 2015/0255940 A1* | 9/2015 | Seals | H01R 31/065 |
| | | | 439/620.21 |
| 2015/0309075 A1* | 10/2015 | Parks | G01R 1/0416 |
| | | | 324/126 |
| 2016/0181752 A1* | 6/2016 | Parks | G06Q 30/0201 |
| | | | 439/517 |
| 2016/0380413 A1* | 12/2016 | Cruz | H02H 7/22 |
| | | | 361/668 |
| 2017/0214225 A1* | 7/2017 | Ramachandran | H02J 9/06 |
| 2020/0153208 A1* | 5/2020 | Miller | H02B 1/03 |
| 2020/0169050 A1* | 5/2020 | Walsh | H01H 71/025 |
| 2020/0328586 A1 | 10/2020 | Eriksen et al. | |
| 2020/0379021 A1* | 12/2020 | Karlgaard | G01R 22/061 |
| 2021/0006073 A1* | 1/2021 | Donahue | H02J 3/388 |
| 2022/0173603 A1 | 6/2022 | Miller et al. | |
| 2022/0216728 A1 | 7/2022 | Ashman et al. | |

\* cited by examiner

METER COLLAR ADAPTER WITH ELECTRIC LOAD MANAGEMENT AND OVERCURRENT PROTECTION

TECHNICAL FIELD

The embodiments described and recited herein pertain, generally, to electrical load control and the integration of distributed energy resources, and more specifically, a device for management and overcurrent protection of electric loads for electric equipment.

BACKGROUND

Distributed energy resources (DER) are smaller power sources that can be aggregated to provide power necessary to meet regular demand. As the electric grid continues to modernize, DERs such as photovoltaic solar panels, wind turbines, electric vehicles, energy storage batteries and advanced renewable technologies and the related electrical service equipment can help facilitate the transition to a smarter grid. Further, as developments in DER technologies progress, associated costs are falling, performance efficiencies are increasing, and demands for greater integration of disparate functionality is rising.

SUMMARY

The embodiments described and recited herein pertain, generally, to electrical load control and the integration of distributed energy resources, and more specifically, a device for management and overcurrent protection of electric loads for electric equipment.

In accordance with an example embodiment, a meter collar adapter is provided with a load management device to manage electrical load to an external, co-located electric equipment to provide overcurrent protection. The meter collar adapter includes a housing, a plurality of contacts to electrically connect the meter collar adapter to a meter socket and to a utility meter, and the load management device. The load management device includes an interface circuit to electrically connect to at least one of a line side or a load side of a service line through the utility meter to electrically connect to the external, co-located electric equipment and an interface contact to electrically connect the co-located electric equipment to the interface circuit. The load management device further includes an overcurrent protection device electrically connected in series with the interface circuit and an adjustable electrical switch electrically connected in series with the interface circuit. The adjustable electrical switch is configured to control an amount of electrical load through the interface circuit. The load manage device also includes an energy management unit configured to measure electrical load through the utility meter and to control a position of the adjustable electrical switch to manage the electrical loads to the co-located electric equipment.

In accordance with yet another example embodiment, a method is provided for managing electrical load to an external, co-located electric equipment. The method includes collecting current data from one or more current sensors on at least one of a line side or a load side of a utility meter. The method further includes analyzing the current data to determine management of an electrical load to an external, co-located electric equipment by controlling an adjustable electrical switch of a load management device. The load management device includes an interface circuit electrically connected to at least one of the line side or the load side of the utility meter and electrically connected to the external, co-located electric equipment, and the adjustable electrical switch electrically connected in series with the interface circuit and configured to control an amount of electrical load through the interface circuit. The method also includes managing the electrical load to the external, co-located electric equipment by controlling a position of the adjustable electrical switch.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
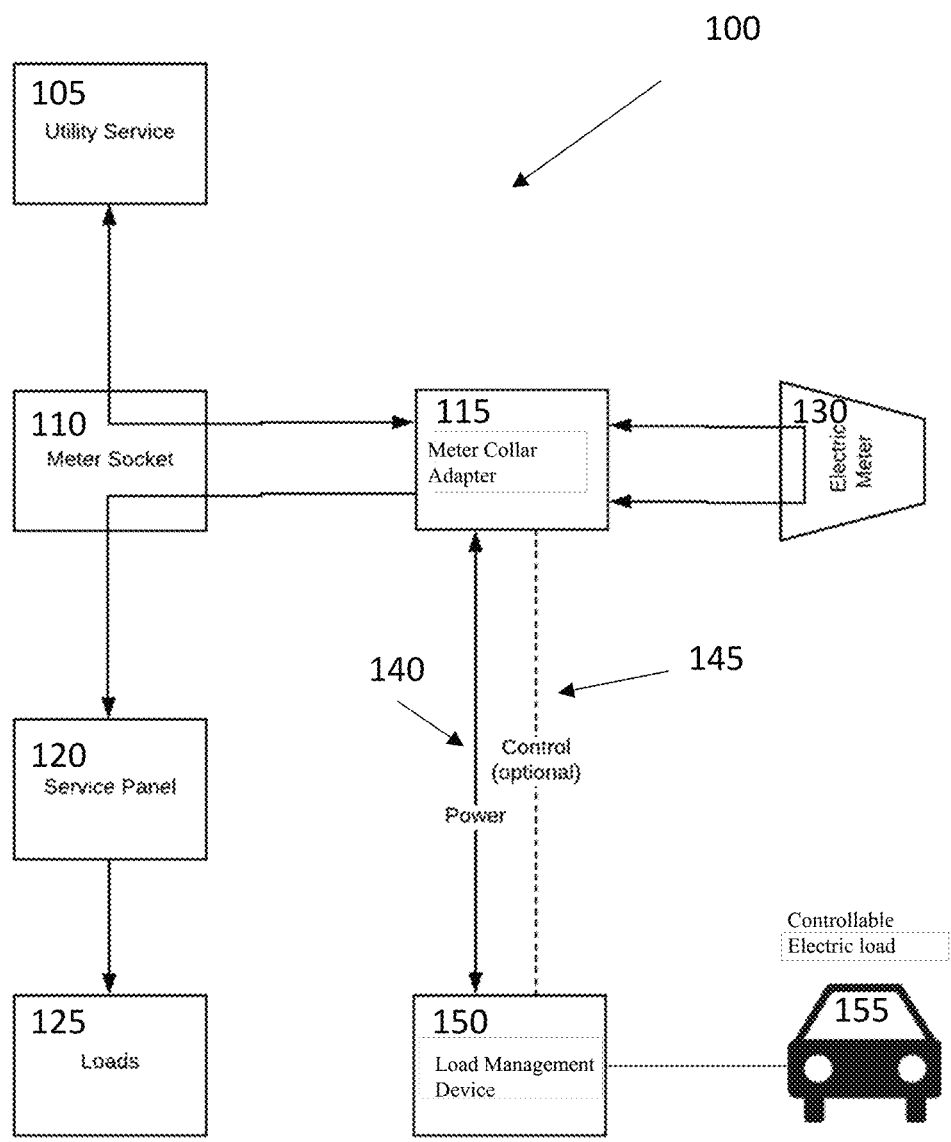
FIG. 1 shows a schematic drawing of a power distribution system, in accordance with at least one example embodiment described and recited herein.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not intended to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Described and recited herein are embodiments of an electric vehicle charger and related energy storage devices having load-management capabilities and on-site powering capabilities. The present embodiments, which are not intended to be limiting, present cost-effective solutions while adhering to regulated standards, e.g., National Electrical Code rules. Further, the embodiments described and recited herein include dedicated circuits to implement ride-through of a site-level power outage.

An example embodiment of the invention includes an electric vehicle or related battery storage system and service equipment comprised of battery and power electronics housing and meter adapter or meter connected by a pluggable interface. Utility communications use either cellular or advanced metering infrastructure for communications. A meter or plastic meter collar containing grid voltage sensing, line-side disconnect, connection for plug terminals, and whole-house current sensing. Control software for battery power with multiple settings including—grid support, islanded home back up, electric vehicle support. Software makes decisions from circuit specific requirements due to each site's specific address and connection to grid. An onboard computing platform can be used to make local autonomous decisions about the best mode of operations, either in isolation or in coordination with other systems. A learning algorithm may be implemented to increase the efficiency of the operational decision making.

As electrical service equipment and DERs are connected to the residential power system, the management of the electrical load through the electric meter needs to be monitored and controlled so as not to exceed the utility service rating of the residential power system. As such a system and method are needed to manage the electrical load while having overcurrent protection.

In an embodiment, a load management device is provided that provides a stream-lined connection and electrical load control of a bidirectionally capable distributed energy resource (DER) or electric equipment, such as an electric vehicle, and its associated supply equipment (EVSE), such as a charger, or power export equipment (EVPE). Electric equipment is used herein to describe a component or all of the above. Thus, the load management device provides a system to monitor and control power draw, e.g., electrical load, of newly or currently added electric equipment, such as, EVSE or DER, so that the electrical load does not overload the residential power system.

FIG. 1 shows a schematic drawing of a power distribution system, in accordance with at least one example embodiment described and recited herein. As depicted, system 100 includes, at least, utility service 105, meter socket 110, meter collar adapter 115, service panel 120, loads 125, electric meter 130, load management device 150, and electric equipment, such as, DER or controllable electrical load 155, such as, an electric vehicle and its associated supply equipment, such as a charger.

Utility service 105 may refer to a public utility distribution system that supplies two-phase power via a meter to a customer, such as a residential power system, e.g., utility grid.

Meter socket 110 may refer to a socket having utility-side contacts to interface with utility service 105 and customer-side contacts to electrically connect to a customer's private distribution system, e.g., meter collar adapter 115 and service panel 120.

Meter collar adapter 115 may refer to a device that plugs into the meter socket 110 and resides between the meter socket and electric meter 130.

Service panel 120 may refer to the main service panel that provides a distribution point for the customer's loads 125. This panel usually contains circuit protection devices and terminal points that enable the distribution of power through the private facility.

Loads 125 may refer to the typical loads found in a private facility. Some examples of typical loads include, but not limited to, electric appliances, air conditioners, electric hot water heaters, and electric outlets.

Electric meter 130 may refer to a power metering device that plugs into the meter collar adapter 115. Electric meters are typically utilized to monitor the power consumption or production at a Utility customer's facility for the purpose of billing for the utility service.

Load management device 150 may refer to a charger interface that may interact with meter socket adapter 115 to safely enable a co-located (on the same premises) electric equipment, e.g., electric vehicle 155, to electrically connect to the load (or line) side of meter socket 110. Load management device 150 may be housed in the meter collar adapter 115. In accordance with at least one example embodiment described and recited herein, load management device 150 may reside onboard controllable electric load 155, such as, the electric vehicle, to reduce the number of external enclosures needed for system 100. Alternative form factors include separate enclosures that house EV car chargers or other multi source backup inverters. As used herein, electrically connect or connected refers to both mechanical connection, e.g., wired connection, and a connection that allows the flow of energy, e.g., electrical load.

In accordance with one example operational flow, as described and recited herein, power may be supplied to load management device 150, via utility service 105, meter socket 110, meter collar adapter 115, and wires 140; and communications in the form of digital or analog signals to enable or disable the connection of the controllable electric equipment 155, such as, the electric vehicle, may be supplied to load management device 150 via wires 145. In addition, load management device 150 may communicate with the controllable electric equipment 155, such as, the electric vehicle, to modify the parameters including, but not limited to, power output level or power factor compensation.

In accordance with at least one example implementation, power may be routed directly from the load side of meter collar adapter 115 to load management device 150. In accordance with at least one additional or alternative implementation, controllable electric equipment 155, such as, the electric vehicle, may supply power to the grid or to loads 125. The aforementioned implementations may be enacted depending on program settings, determined by the local utility regulations and end user inputs, programed into the monitoring and control circuit.

In accordance with a non-limiting example implementation, in the event of a grid outage, meter collar adapter 115 may be configured to disconnect from the grid, i.e., utility service 100, while maintaining an electrical connection to load management device 150 as well as the controllable electric equipment 155, such as, electric vehicle, and to service panel 120, thereby supplying power from controllable electric equipment 155, such as, the electric vehicle, to loads 125. Meter collar adapter 115 may be configured to inform the load management device 150 that the islanding relay contacts are open by sending a signal over the control interface 145. Accordingly, load management device 150 may enable the electric vehicle to energize the power connection and pick up the service panel 120 and loads 125.

Figure 2:
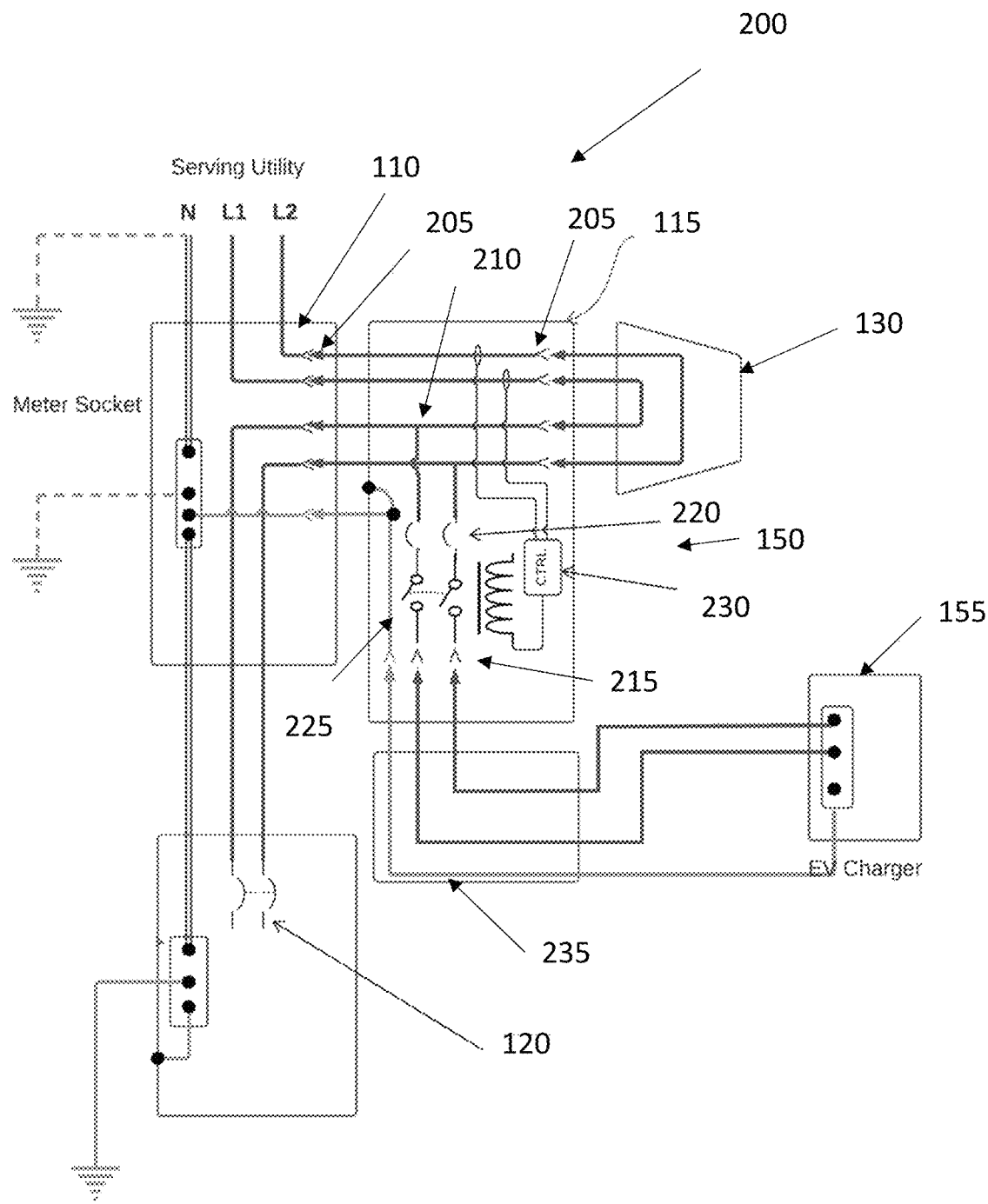
FIG. 2 shows a schematic drawing of a power distribution system, in accordance with at least one example embodiment described and recited herein.

FIG. 2 shows a schematic drawing of a power distribution system 200 including the load management device with overcurrent protection, in accordance with at least one example embodiment described and recited herein. That is, FIG. 2 shows system 200 that includes meter collar adapter 115 including the load management device 150 interconnected at a site with electrical loads on a grid side circuit interconnection point, with power flowing between the grid, the site, and the controllable electrical load.

Meter collar adapter 115 houses the mating contacts or connectors for the power and control interfaces which may be electrically connected to the meter collar adapter 115, which may have plug type connectors for, e.g., AC power Line 1, Line 2, and Neutral, e.g., ground. In an embodiment, the meter collar adapter 115 includes a plurality of contacts 205 to electrically connect the meter collar adapter 115 to a meter socket 110, which is connected to the AC power lines L1, L2 and neutral, and to connect to utility meter 130.

In accordance with at least one example implementation, the meter collar adapter 115 houses the load management device 150. In an another embodiment, the load management device 150 is connectable to the meter collar adapter 115 which facilitates the electrical connection of the load management device 150 to the power lines.

As depicted, load management device 150 includes, at least, interface circuit 210, interface contact 215, overcurrent protection device 220, an adjustable electrical switch 225, and an energy management unit 230.

Optionally, the load management device 150 further includes a communications module, for example, transceivers, for transmitting and receiving data. This communication may be used to transmit the total electrical load, position of the adjustable electrical switch, amount of electrical load for the co-located electric equipment, or the like to co-located electric equipment(s) or interested stakeholders, for example, customers, the owner of the residential building, utility operators, installers, investors, aggregators, or the like to help manage the electrical loads for the building or utility grid. The communications may be implemented in many forms including but not limited to digital 10, analog 10, and industrial standard serial protocols or wireless communications, e.g., Bluetooth, Wi-Fi, Internet, NEC, RF, or the like.

Interface circuit 210 may be integrated into the meter collar adapter 115 to electrically connect to at least one of a line side (utility side of meter) or load side (premises/customer side of meter) of a service line, e.g., L1 or L2, through the utility meter 130 to a primary load 125 through the service panel 120 and the utility meter. Interface circuit 210 may also be electrically connected to the external, co-located electric equipment 155.

The external, co-located electric equipment 155 may include a bidirectionally capable distributed energy resource (DER), such as an electric vehicle or energy storage batteries, and its associated supply equipment (EVSE), such as a charger, or power export equipment (EVPE).

In a non-limiting example, the interface circuit 210 may include an interface contact 215 to electrically connect the co-located electric equipment 115 to the interface circuit 210. In an embodiment, the interface contact 215 may be provided to directly connect to the EVSE or DER, e.g., a pluggable outlet. In another embodiment, the interface contact 215 may be a plug type connector that is electrically connected to a touch-safe field-removable and reversible junction box 235.

Touch-safe field-removable and reversible junction box 235 may be connected to the meter collar adapter 115 via an externally accessible connector, e.g., on an outer surface of the meter collar adapter 115. Touch-safe field-removable and reversible junction box 235 may be electrically connected to the EVSE, such as a charging unit 155 for charging the DER, or may include service equipment directly connected with the DER. It is appreciated that the touch-safe field-removable and reversible is a connectable system that may be a pluggable power interface. The junction box may include any of the following features: field-wireable, weatherproof and removable junction box, integrated power and ground connectors capable of quick-connect/quick-release mating, hinged clasps that secure junction box to meter socket adapter, and are capable of being locked in the secured position, as is typical with 'lockout/tagout' safety protocol, one or more contactors or overcurrent protection devices, one or more CT's for sensing power/current, and one or more communication modules to capture and transmit data. It is appreciated that the term reversible is at least directed to being mountable or pluggable in either the right or left mount positions in the meter collar adapter. As such, junction box 235 is a touch-safe field-removable and reversible junction box in-line with the interface circuit to the electric equipment that facilitates the connection and disconnection of the interface circuit from the electric equipment without the need for tools.

Overcurrent protection device 220 is electrically connected in series with the interface circuit 210. Overcurrent protection device may include circuit breakers that are integrated into the interface circuit to provide overcurrent protection against short circuit faults. As such, overcurrent protection device 220 provides circuit protection between the utility side connection to service lines L1, L2 and the external, co-located electric equipment 155 as close as practical to the service entrance at the meter socket 115. The overcurrent protection device can consist of, but is not limited to, circuit breakers or fuses rated for the power flow being provided by the backup source, e.g., between 30 A and 100 A, and preferably between 40 A and 60 A. In a non-limiting embodiment, overcurrent protection device 220 may protrude from the housing of the meter socket adapter 115 so that it may be accessible externally of the meter socket adapter 115. As such, overcurrent protection device 220 may be operated manually, e.g., tripping the circuit breaker manually, and/or allows the replacement of the breaker switch or fuse when necessary, e.g., replacing with higher amperage switch or fuse or blown switch or fuse.

Adjustable electrical switch 225 is electrically connected in series with the interface circuit 210. Adjustable electrical switch 225 is configured to control an amount of electrical load through the interface circuit 210 to the co-located electric equipment. In a non-limiting example, adjustable electrical switch 225 may be an open/close relay switch that opens to disconnect the co-located electric equipment 155 from the utility service lines L1, L2. In an another non-limiting example, the adjustable electrical switch 225 may include an adjustable resistor, e.g., rheostat, to adjust the amount of electrical load through the interface circuit 210 to the co-located electric equipment. It is appreciated that adjustable electrical switch 225 may include alternative designs and controls, for example, controlling the flow of current by adjusting the timing of the opening and closing of the relay switch or having multiple resistors and switches in parallel to control the amount of the electrical load to the co-located electric equipment.

Energy management unit 230 measures electrical load through the utility meter 130 and controls a position of the adjustable electrical switch 225 to manage the electrical loads to the co-located electric equipment 155. In a non-limiting example, energy management unit 230 includes a processor or micro-processor and/or memory to receive measurements of the electrical load, e.g., via current sensors on the utility service lines L1, L2 and/or the interface circuit to the co-located electric equipment and determines the amount of electrical load that may be provided to the co-located electric equipment 155. In an embodiment, energy management unit 230 is powered via the load side of the utility service line to simply the power supply design. In an another non-limiting example, energy management unit 230 includes analog circuitry and discrete digital logic for managing the amount of electrical load to the co-located electric equipment.

Energy management unit 230 monitors the electrical load provided through the utility service lines L1, L2 that provides power to the primary load 125, e.g., residential house loads, and the co-located electric equipment 155, e.g., EVSE or charger. Based on the measured electrical load, the energy management unit 230 determines the total electrical load provided through the utility meter 130 and compares the total electrical load to the service rating of the residential (or commercial) building, e.g., rating of whole service (100 AMP, 200 Amp, or 320 Amp). It is appreciated that the service rating of the residential or commercial building may be determined based on a number of different components, for example, in a non-limiting example, the main service wire(s), meter socket rating, panel ratings, utility capabilities, or the like.

If energy management unit 230 determines that the total electrical load is greater than or within a predetermined threshold of the service rating of the residential (or commercial) building, energy management unit 230 controls the position of the adjustable electrical switch 225 to perform at least one of disconnecting the co-located electric equipment 155, adjusting an amount of electrical load provided to the co-located electric equipment 155, or a combination thereof. In an embodiment, the predetermined threshold may be +/−5% of the maximum service rating of the residential building. In a non-limiting example, the energy management unit 230 may control the adjustable electrical switch 225 to disconnect if the total electrical load is greater than the predetermined threshold for longer than 0.1 seconds.

In a non-limiting embodiment, energy management unit 230 may control the adjustable electrical switch 225, which may be an open/close relay switch, to an open position which disconnects or stops the flow of the electrical load to the co-located electric equipment 155. As such, the total aggregate electrical load through the service lines will decrease and be below the service rating of the residential (or commercial) building.

Energy management unit 230 may then determine when the co-located electric equipment 155 may be reconnected to the utility service lines for receiving the electrical load. For example, in a non-limiting embodiment, when the electrical load to the primary load(s) of the residential building falls below a predetermined threshold value, e.g., below 120 A for a service rating of 200 A, control logic of the energy management unit 230 determines whether or not the co-located electric equipment 155 may be reconnected so that the total electrical load remains below the service rating of the residential building. In an embodiment, if the electrical load to the primary load(s) is below 120 A for five minutes, the energy management unit 230 may control the adjustable electrical switch to close so that electrical load can be supplied to the co-located electric equipment.

It is appreciated that since the electrical load should not be provided at or near the maximum amount of continuous electrical load for prolonged periods of time allowed by the electrical system, e.g., due to excessive heat generation, the determination of whether or not the co-located electric equipment 155 should be reconnected may be based on various additional conditions or factors.

Figure 3:
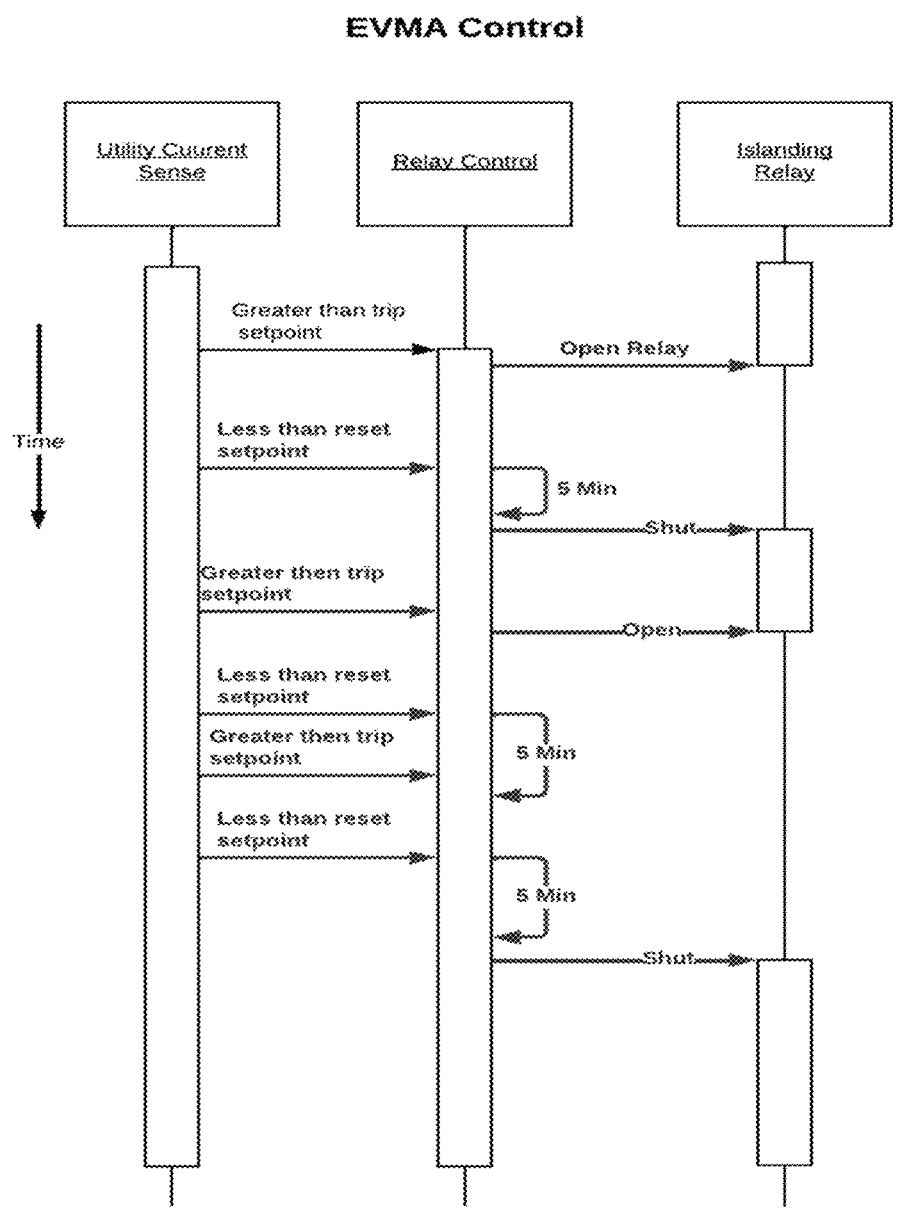
FIG. 3 shows a schematic drawing of a method for controlling reconnecting the co-located electric equipment, in accordance with at least one example embodiment described and recited herein.

FIG. 3 illustrates an example embodiment for controlling the reconnection of the co-located electric equipment. As seen in FIG. 3, if the total electrical load is greater than the predetermined threshold, the energy management unit 230 controls the adjustable electrical switch 225 to open to disconnect the co-located electric equipment 155 from the utility service line(s). After energy management unit 230 determines that the total electrical load is below a predetermined reset threshold, for example, below 60 to 50% of the maximum service rating, e.g., 120 A or 100 A for a 200 A system, for a predetermined amount of time, e.g., one, five, ten, or fifteen minutes, the energy management unit 230 controls the adjustable electrical switch 225 to close to reconnect the co-located electric equipment 155. Energy management unit 230 may also include logic to determine, whether after the closing of the adjustable electrical switch 225, the reconnection of the co-located electric equipment 155 will increase the total electrical load to be greater than the predetermined threshold. If the total electrical load would be greater than the predetermined threshold, energy management unit 230 maintains the adjustable electrical switch 225 in the open position. If after the predetermined amount of time the total electrical load is determined to be below the predetermined reset threshold, energy management unit 230 may close the adjustable electrical switch 225 to reconnect the co-located electric equipment 155.

In an embodiment, if the logic determines that the total electrical load is above the predetermined threshold, energy management unit 230 may increase the amount of time the co-located electric equipment 155 should be disconnected from the utility service line. For example, if the total electrical load is predicted to remain higher than 180 A, energy management unit 230 may continue disconnection for ten minutes. If after ten minutes, energy management unit 230 determines that the total electrical load would still be higher than the predetermined value, the energy management unit 230 may then continue disconnection for thirty minutes.

In another non-limiting embodiment, energy management unit 230 may reconnect the adjustable electrical switch 225 if the total electrical load is below the predetermined threshold, e.g., 25 A below the utility service rating. If after the first attempt to reconnect fails, e.g., the total electrical load to the residential building and EVSE remains higher the predetermined threshold, the energy management unit 230 may include a time delay, e.g., 30 minutes, for remaining below the predetermined threshold before attempting to reconnect the co-located electric equipment 155. If the adjustable electrical switch 225 is connected and even after the time delay attempt to reconnect, the energy management unit 230 disconnects the adjustable electrical switch 225, the load management device may enter into a lockout state which requires manual reset, e.g., a reset button, to reconnect the co-located electric equipment 155.

In another non-limiting embodiment, energy management unit 230 may control the adjustable electrical switch 225 to adjust the electrical load to the co-located electric equipment 155. For example, in an embodiment, the adjustable electrical switch 225 may be an adjustable rheostat switch that changes the length of the resistor to control varying amounts of electrical load. As such, if additional electrical load is provided for the primary load(s), the total aggregate electrical load may be adjusted by decreasing the electrical load to the co-located electric equipment 155 to maintain the total electrical load to be below the service rating of the residential (or commercial) building. It is appreciated that the adjusting of the electrical load to the co-located electric equipment 155 may occur simultaneously with the instantaneous current readings of the electrical load measurements, e.g., PI or PID controller to maintain a set point of the total electrical load, or after the predetermined threshold is exceeded or a combination thereof. This embodiment may be used with the open/close relay switch, as discussed above, so that if, even after, reducing the electrical load to the co-located electric equipment 155, the total electrical load is at or near the maximum service rating, the co-located electric equipment 155 may be disconnected to decrease the total electrical load.

In a non-limiting embodiment, the energy management unit 230 may include a field-configurable interface, such as, a selectable switch or button, to select different maximum service ratings for the meter collar adapter 115. As such, the switch allows the selection of the operation of the energy management device to control the adjustable electrical switch 225 by controlling when the adjustable electrical switch 225 is opened or closed to disconnect the co-located electric equipment 155 or the adjustment of the positions of the adjustable electrical switch to control the amount of electrical load supplied to the co-located electric equipment 155. That is, the field-configurable interface is a device to adjust a load current rating of the load management device 150 to set open and close conditions for the adjustable electrical switch 225 for disconnecting the co-located electric equipment 155. For example, the selection switch may include selection of a 100 A, 200 A, or 320 A service (or in 25 A increments between 100 A and 200 A). If the 100 A service is selected, the energy management unit 230 is programmed such that the energy management unit 230 controls the adjustable electrical switch to disconnect or control the amount of electrical load when a predetermined threshold of 95 A is reached or exceeded and reset when the predetermined reset threshold of 60 A is reached. Similarly, if the 200 A service is selected, energy management unit 230 controls the adjustable electrical switch to disconnect or control the amount of electrical load when a predetermined threshold of 190 A is reached or exceeded and reset when the predetermined reset threshold of 120 A is reached.

Energy management unit 230 may also include an interlock that is hardwired or provided by software that prevents the closing of the adjustable electrical switch 225. For example, in an embodiment, the interlock may be set at 25 A below the maximum service rating, which prevents the reclosing (or auto-reclosing) of the adjustable electrical switch 225 unless the total electrical load is below the interlock value.

Energy management unit 230 may also include a visual indicator to indicate a status of the load management device 150. For example, in an embodiment, the visual indicator may be a color-coded LED, e.g., red and green, to show whether the adjustable electrical switch is in the open position, e.g., disconnecting the co-located electric equipment, or the closed position, e.g., connect the co-located electric equipment. In an embodiment, the visual indicator may be a single LED or an indication on a display, e.g., percentage of electrical load or open or closed, that may be viewed externally.

As such, the load management device 150 and energy management unit 230 provides for a method which includes collecting current data from one or more current sensors on at least a line side or a load side a utility meter, e.g., service line; analyzing the current data to determine management of an electrical load to an external, co-located electric equipment by controlling an adjustable electrical switch of a load management device; and managing the electrical load to the external, co-located electric equipment by controlling a position of the adjustable electrical switch.

In a non-limiting embodiment, the managing of the electrical load includes at least one of setting an electrical current predetermined threshold for a total electrical load through the service line; controlling the adjustable electrical switch when a measured current supplied through the service line to both the primary load and the interface circuit exceeds the predetermined threshold; controlling the adjustable electrical switch when the measured current to both the primary load and interface circuit is below the predetermined threshold; opening the adjustable electrical switch when the measured current supplied through the service line to both the primary load and the interface circuit exceeds the predetermined threshold; and reclosing the adjustable electrical switch, after a time-delay, when the measured current supplied through the service line to both the primary load and interface circuit falls below a predetermined reset threshold, for a period of time.

In yet another non-limiting example, the meter collar adapter 115 having the load management device 150 includes the adjustable electrical switch 225 that includes at least one of the following: in a default closed state, such that when installing the meter collar adapter 115 on the meter socket 110, the manual or automated opening of the adjustable electrical switch 225 opens the interface circuit 210 and resets control protocols for controlling the electrical load to the co-located electric equipment 155, or in a default open state, such that the adjustable electrical switch is in the closed state after a selection of a control for a service rating for the load management device.

Figure 4:
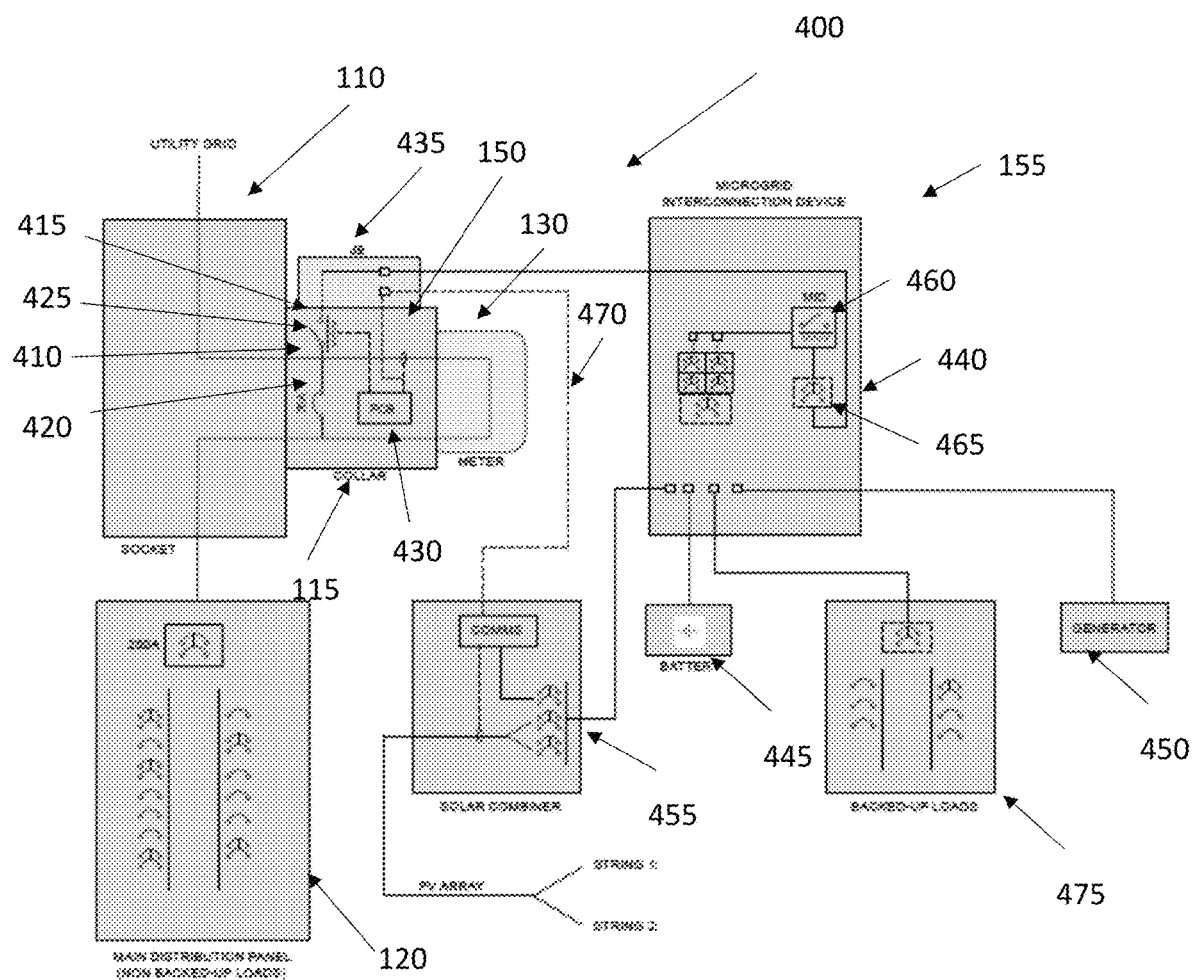
FIG. 4 shows a schematic drawings of an energy storage system, in accordance with at least one example embodiment described and recited herein.

FIG. 4 shows a schematic drawing of a power distribution system 400 having the load management device with overcurrent protection, in accordance with at least one example embodiment described and recited herein. That is, FIG. 4 shows system 400 that includes meter collar adapter 115 including the load management device 150 interconnected at a site with electrical loads, with power flowing between the grid, the site, and the controllable electrical load.

Meter collar adapter 115 houses the mating contacts or connectors for the power and control interfaces which may be electrically connected to the meter collar adapter 115, which may have plug type connectors for, e.g., AC power Line 1, Line 2, and Neutral, e.g., ground. In an embodiment, the meter collar adapter 115 includes a plurality of contacts to electrically connect the meter collar adapter 115 to a meter socket 110, which is connected to the AC power lines and neutral, and to connect to utility meter 130.

In accordance with at least one example implementation, the meter collar adapter 115 houses the load management device 150. In another embodiment, the load management device 150 is connectable to the meter collar adapter 115 which facilitates the electrical connection of the load management device 150 to the power line(s).

As depicted, load management device 150 includes, at least, interface circuit 410, interface contact 415, overcurrent protection device 420, an adjustable electrical switch 425, and an energy management unit 430.

Interface circuit 410 may be integrated into the meter collar adapter 115 to electrically connect to at least one of a line side or load side of a service line through the utility meter 130 to a primary load 125 through the service panel 120. Interface circuit 410 may also be electrically connected to the external, co-located electric equipment 155.

In a non-limiting example, the interface circuit 410 may include an interface contact 415 to electrically connect the co-located electric equipment 155 to the interface circuit 410. In an embodiment, the interface contact 415 may be provided to directly connect to the co-located electric equipment, e.g., EVSE, DER, ESS, etc. In another embodiment, the interface contact 415 may be a plug type connector that is electrically connected to a touch-safe field-removable and reversible junction box 435.

Touch-safe field-removable and reversible junction box 435 may be connected to the meter collar adapter 115 via an externally accessible connector, e.g., on an outer surface of the meter collar adapter 115, without the use of tools. Touch-safe field-removable and reversible junction box 435 may be electrically connected to the co-located electric equipment 155, such as, EVSE, directly or through co-located electrical equipment, e.g., a microgrid interconnection device 440 to allow a bidirectional flow of electrical energy from bidirectionally capable distributed energy resource(s) (DER), such as an electric vehicle or energy storage batteries 445, or power export equipment (EVPE). As such, the microgrid interconnection device 440 is provided to help facilitate a bidirectional connection with the DERs and integrated automatic switching of interface circuit, from utility connected to islanded (disconnected from utility grid), and back to utility connected, based on the availability status of the local utility grid at any time. Microgrid interconnection device 440 may reside in a separate enclosure that provides the interconnection between meter socket adapter 115 and the DERs. Microgrid interconnection device 440 houses the components needed to isolate the DER outputs from interconnection to the grid at meter collar adapter 115, and transfer the power connection to the islanded grid forming interface and backed-up loads 475 in the event of a utility power outage.

As depicted in FIG. 4, microgrid interconnection device 440 may include disconnect switch 460 and terminal connections and/or overcurrent protection 465 for the DERs and backed-up loads 475.

Based on data through data line 470, which may be hardwired or transmitted wirelessly, and/or voltage sensing of the interface circuit 410 regarding grid power status received via meter collar adapter 115, microgrid interconnection device 440 may operate disconnect switch 460; alternatively, based on the data regarding grid power status received via meter collar adapter 115, microgrid interconnection device 440 may operate disconnect switch 460 to switch to islanding mode to/for devices capable of operating in islanding mode to supply electrical load to the backed-up loads 475, which may be the same or different loads associated with the primary load 125 of the residential building. Microgrid interconnection device 445 may also allow using the DERs, e.g., the solar combiner and/or battery to act as an electrical source to supply electrical energy to the primary loads and/or the utility grid when disconnect switch 460 is closed and the utility grid is present.

Overcurrent protection device 420 is electrically connected in series with the interface circuit 410. Overcurrent protection device may include circuit breakers that are integrated into the interface circuit to provide overcurrent protection again short circuit faults. As such, overcurrent protection device 420 provides circuit protection between the utility side connection to service lines and the external, co-located electric equipment 155 as close as practical to the service entrance at the meter socket 115.

Adjustable electrical switch 425 is electrically connected in series with the interface circuit 410. Adjustable electrical switch 425 is configured to control an amount of electrical load through the interface circuit 410. In a non-limiting example, adjustable electrical switch 425 may be an open/close relay switch that opens to disconnect the co-located electric equipment 155 from the utility service line. In an another non-limiting example, the adjustable electrical switch 425 may include an adjustable resistor, e.g., rheostat, to adjust the amount of electrical load through the interface circuit 210 to the co-located electric equipment.

Energy management unit 430 measures electrical load through the utility meter 130 and controls a position of the adjustable electrical switch 425 to manage the electrical loads to the co-located electric equipment 155. In a non-limiting example, energy management unit 430 includes a processor or micro-processor to receive measurements of the electrical load, e.g., via current sensors on the utility service line and/or the interface circuit and determines the amount of electrical load that may be provided to the co-located electric equipment 155.

Energy management unit 430 monitors the electrical load provided through the utility service line that provides power to the primary load 125, e.g., residential house loads, and the co-located electric equipment 155, e.g., EVSE or charger. Based on the measured electrical load, the energy management unit 430 determines the total electrical load provided through the utility meter 130 and compares the total electrical load to the service rating of the residential (or commercial) building, e.g., rating of whole service (100 AMP, 200 Amp, or 320 Amp). It is appreciated that the service rating of the residential or commercial building may be determined based on a number of different components, for example, in a non-limiting example, the main service wire(s), meter socket rating, panel ratings, utility capabilities, or the like.

If energy management unit 430 determines that the total electrical load is greater than or within a predetermined threshold of the service rating of the residential (or commercial) building, energy management unit 430 controls the position of the adjustable electrical switch 425 to perform at least one of disconnecting the co-located electric equipment 155, adjusting an amount of electrical load provided to the co-located electric equipment 155, or a combination thereof. In an embodiment, the predetermined threshold may be +/−5% of the maximum service rating of the residential building. In a non-limiting example, the energy management unit 430 may control the adjustable electrical switch 425 to disconnect if the total electrical load is greater than the predetermined threshold for longer than 0.1 seconds.

In a non-limiting embodiment, the energy management unit 430 and the microgrid interconnection device 440 may be controlled to manage bidirectional flow of electrical energy or electrical load to the utility grid. For example, the energy management unit 430 may control the load management device 150 to manage electrical load from the meter collar adapter 115 to the external, co-located electric equipment 155 or allow the external, co-located electric equipment 155 to act as an energy source to supply the electrical energy back through the load management device 150 and to the utility grid and/or act as a power source for the premises electrical system, e.g., for the primary loads. As such, since the load management device 150 and the microgrid interconnection device 440 may allow the connection and disconnection of the co-located electric equipment 155 from the utility grid, primary loads, and/or the backed-up loads, the system components may communicate with each other to facilitate the direction, timing and quantity of electrical load or electrical energy through the load management device 150. It is appreciated that the system components may include devices connected to the primary loads or backed-up loads, or electric equipment, and to third party devices, e.g., not associated with the meter collar adapter, meter socket, or utility meter, that are associated with the electric equipment, e.g., solar combiner from a third party vendor.

The meter collar adapter having the load management device, as discussed herein, has at least the following advantages:

Since the meter collar adapter and load management device are connected upstream or north of the service panel and/or the primary loads, e.g., the residential building, the connection to a co-located electric equipment is not limited by the service rating of the electrical panel of the residential building. Rather, the addition of any co-located electric equipment is limited by the service rating of the utility supply line, e.g., through the meter socket.

Furthermore, since the meter collar adapter is installed upstream of the service panel, the service panel does not have to be upgraded to accommodate for the connection to the co-located electric equipment.

Moreover, since the meter collar adapter is connected to the meter socket, the installer or technician is provided with a simpler interface for connection to a co-located electric equipment.

Additionally, since the energy management unit is receiving current data from the line side of the utility service line, a more accurate electrical load may be determined, e.g., sensing current downstream of the service panel could potentially have noise.

Since the meter collar adapter may include the load management device, additional overcurrent protection devices are not required by the service panel, but rather, the co-located electric equipment is protected from overcurrent by the load management device.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A meter collar adapter, comprising:
    a housing;
    a plurality of contacts to electrically connect the meter collar adapter to a meter socket and to a utility meter; and
    a load management device within the housing to manage electrical load to an external, co-located electric equipment, comprising:
        an interface circuit to electrically connect at least one of a line side or a load side of a service line to the external, co-located electric equipment, wherein the interface circuit comprises connections, within the housing, with the service line,
        an interface contact to electrically connect the co-located electric equipment to the interface circuit,
        an overcurrent protection device electrically connected in series with the interface circuit,
        an adjustable electrical switch electrically connected in series with the interface circuit and configured to control an amount of electrical load through the interface circuit, and
        an energy management unit configured to:
            measure electrical load through the meter collar adapter using one or more sensors within the housing that measure current on the line side of the service line; and
            control a position of the adjustable electrical switch to manage the electrical load through the interface circuit to the co-located electric equipment.

2. The meter collar adapter of claim 1, further comprising: one or more electrical current sensors, connected to a supply side or the line side of the utility meter, to respectively measure electrical load drawn through the utility meter.

3. The meter collar adapter of claim 1, wherein the overcurrent protection device is manually operable external to the load management device to disconnect the external, co-located electric equipment.

4. The meter collar adapter of claim 1, further comprising one or more data transceivers to communicate data with the load management device.

5. The meter collar adapter of claim 4, wherein the one or more data transceivers further communicate the data with other co-located electric equipment.

6. The meter collar adapter of claim 1, further comprising a field-configurable interface to adjust a load current rating of the load management device to set open and close conditions for the adjustable electrical switch for disconnecting the co-located electric equipment.

7. The meter collar adapter of claim 1, further comprising a visual indicator that is configured to indicate an open or closed status of the adjustable electrical switch.

8. The meter collar adapter of claim 1, further comprising a touch-safe field-removable and reversible junction box in-line with the interface circuit to the electric equipment that facilitates the connection and disconnection of the interface circuit from the electric equipment without the need for tools.

9. The meter collar adapter of claim 1, wherein the load management device is configured to manage electrical load from the co-located electrical equipment to the meter socket.

10. The meter collar adapter of claim 1, wherein the energy management unit is configured to control the position of the adjustable electrical switch to manage the electrical load through the interface circuit from the co-located electric equipment to the meter socket.

11. The meter collar adapter of claim 1, wherein the energy management unit is configured to control the position of the adjustable electrical switch to manage the electrical load through the interface circuit from the co-located electric equipment to the meter socket based on a service rating of a building to which the meter socket is attached.

12. A method comprising:
    collecting current data from one or more current sensors located on at least one of a line side or a load side of a service line of a utility meter;
    analyzing the current data to determine management of an electrical load to an external, co-located electric equipment by controlling an adjustable electrical switch of a load management device,
    wherein the load management device comprises:
        an interface circuit electrically connected at least one of the line side or the load side of the utility meter and electrically connected to the external, co-located electric equipment, wherein the interface circuit comprises connections, within the housing, with at least one of the line side or the load side, and
        the adjustable electrical switch electrically connected in series with the interface circuit and configured to control an amount of electrical load through the interface circuit;
    managing the electrical load through the interface circuit to the external, co-located electric equipment by controlling a position of the adjustable electrical switch by measuring the electrical load through the meter collar adapter using one or more sensors within the housing that measure current on the line side of the service line to control the position of the adjustable electrical switch.

13. The method of claim 12, wherein the managing of the electrical load comprises at least one of:
  setting an electrical current predetermined threshold for a total electrical load through the service line;
  controlling the adjustable electrical switch when a measured current supplied through the service line to both the primary load and the interface circuit exceeds the predetermined threshold;
  controlling the adjustable electrical switch when the measured current to both the primary load and interface circuit is below the predetermined threshold;
  opening the adjustable electrical switch when the measured current supplied through the service line to both the primary load and the interface circuit exceeds the predetermined threshold; or
  reclosing the adjustable electrical switch, after a time-delay, when the measured current supplied through the service line to both the primary load and interface circuit falls below a predetermined reset threshold, for a period of time.

14. The method of claim 12, further comprising communicating data to stakeholders including customers, installers, aggregators, and investors.

15. The method of claim 12, further comprising providing a visual indicator, that is controlled to indicate a position of the adjustable electrical switch.

16. The method of claim 12, wherein a default state of the adjustable electrical switch includes at least one of:
  a closed state, and the manual or automated opening of the adjustable electrical switch opens the interface circuit and resets control protocols; or
  an open state, wherein the adjustable electrical switch is in the closed state after a selection of a control for a service rating for the load management device.

17. The method of claim 12, further comprising communicating the measured data to any connected third party devices.

18. The method of claim 12, further comprising managing electrical load from the co-located electrical equipment to the meter socket.

19. The method of claim 12, further comprising controlling the position of the adjustable electrical switch to manage the electrical load through the interface circuit from the co-located electric equipment to the meter socket.

20. The method of claim 12, further comprising controlling the position of the adjustable electrical switch to manage the electrical load through the interface circuit from the co-located electric equipment to the meter socket based on a service rating of a building to which the meter socket is attached.

* * * * *